United States Patent
Sciacero et al.

(10) Patent No.: US 6,636,048 B2
(45) Date of Patent: Oct. 21, 2003

(54) METHOD FOR DIAGNOSING PERFORMANCE PROBLEMS IN CABLING

(75) Inventors: James R. Sciacero, Scottsdale, AZ (US); James G. Tonti, Valkaria, FL (US)

(73) Assignee: Microbest, Inc., Phoenix, AZ (US)

( * ) Notice: Subject to any disclaimer, the term of this patent is extended or adjusted under 35 U.S.C. 154(b) by 0 days.

(21) Appl. No.: 10/177,627

(22) Filed: Jun. 18, 2002

(65) Prior Publication Data

US 2002/0163340 A1 Nov. 7, 2002

Related U.S. Application Data

(62) Division of application No. 09/569,005, filed on May 11, 2000, now Pat. No. 6,433,558.
(60) Provisional application No. 60/133,932, filed on May 13, 1999.

(51) Int. Cl.[7] .............................................. G01R 27/04
(52) U.S. Cl. .................... 324/520; 324/628; 324/76.19; 324/539
(58) Field of Search ................................. 324/520, 527, 324/528, 539, 543, 628, 66, 76.19, 76.21, 76.24

(56) References Cited

U.S. PATENT DOCUMENTS

| | | | |
|---|---|---|---|
| 3,751,606 A | * 8/1973 | Kaiser, Jr. ................... | 324/520 |
| 5,251,151 A | 10/1993 | Demjanenko et al. ........ | 702/56 |
| 5,517,537 A | 5/1996 | Greene et al. ............... | 376/252 |
| 5,524,281 A | 6/1996 | Bradley et al. ............. | 455/67.3 |
| 5,532,603 A | 7/1996 | Bottman ..................... | 324/628 |
| 5,539,321 A | * 7/1996 | Sciacero et al. ............ | 324/540 |
| 5,559,427 A | * 9/1996 | Hinds et al. ................. | 324/519 |
| 5,576,480 A | 11/1996 | Hopkins et al. .............. | 73/38 |
| 5,608,657 A | 3/1997 | Conway et al. ............. | 702/183 |
| 5,650,728 A | 7/1997 | Rhein et al. ................ | 324/543 |
| 5,661,615 A | 8/1997 | Waugh et al. ................ | 360/75 |
| 5,673,108 A | 9/1997 | Takeuchi .................... | 356/73.1 |
| 5,680,025 A | 10/1997 | Bowers, III et al. ........ | 318/806 |
| 5,698,985 A | 12/1997 | Bottman ..................... | 324/628 |
| 5,768,148 A | 6/1998 | Murphy et al. ............. | 700/286 |
| 5,821,760 A | * 10/1998 | Koeman et al. ............ | 324/539 |
| 5,862,391 A | 1/1999 | Salas et al. ................. | 713/300 |
| 5,895,141 A | 4/1999 | Budnik et al. ................ | 399/58 |
| 6,002,247 A | * 12/1999 | Watkins ...................... | 324/539 |

* cited by examiner

*Primary Examiner*—N. Le
*Assistant Examiner*—Vincent Q. Nguyen
(74) *Attorney, Agent, or Firm*—Snell & Wilmer (57) ABSTRACT

The present invention provides an apparatus for using time domain analysis of NEXT, Return Loss and the like, in conjunction with the application of time or distance referenced limits to verify and determine compliance of the performance requirements of connections in a typical link. Time domain analysis of NEXT, Return Loss data and the like suitably provides the performance characteristics of a link as a function of time or distance. When coupled with time or distance performance curves for connections, it can be determined if the transmission fault is at a connection or in the cable. The time limit curves for connections can be generated based on the frequency domain performance requirements for connecting hardware of a specific level of performance. The connection time limit curves thus allows one to determine if the connection is within performance standards, allowing improved isolation of the fault condition.

10 Claims, 9 Drawing Sheets

METHOD FOR DIAGNOSING PERFORMANCE PROBLEMS IN CABLING

CROSS-REFERENCE TO RELATED APPLICATIONS

This is a divisional application that claims the benefit of U.S. Provisional Application Serial No. 60/133,932, filed May 13, 1999 and U.S. Utility Application Ser. No. 09/569,005, Filed May 11, 2000 now U.S. Pat. No. 6,433,558.

BACKGROUND OF INVENTION

1. Technical Field of the Invention

This invention relates generally to the use of signal processing techniques for determining the performance of cabling connections, and, more particularly, to the development and use of time domain limits to determine the location and source of faults in cabling systems.

2. Background of the Invention

The transmission performance characteristics of modern high speed data communication twisted pair cabling systems are defined by various international and industry working bodies (standards organizations) to assure standard data communication protocols can successfully be transmitted across the transmission media. These data communication cabling systems (known as links) typically consist of connectors (modular B plugs and jacks) and some form of twisted pair cabling. The requirements for important RF transmission performance parameters such as, among others, Near End Crosstalk (NEXT), Return Loss, Insertion Loss, and Equal Level Far End Crosstalk (ELFEXT) are specified as a function of frequency. To assure compliance of cabling systems with these requirements, various field test instruments are available to certify that installed cabling meets the required frequency domain limits. These instruments perform various measurements to verify compliance with the standards and provide an overall Pass or Fail indication of the link.

When failures are detected in a link, a trouble-shooting process must be done to make the link compliant with the requirement. However, currently known field test instruments generally do not provide simplified diagnostic information to help locate and determine the reason for failures. Determining the cause of some RF transmission parameter faults can be difficult since the overall link performance often depends on the performance of the individual components and installation techniques of the link. Until now, there have been few simple yet accurate methods to determine if a fault is at the connection or the within the cable itself. That is, the frequency domain data that is processed by currently known field test instruments does not provide readily interpretable information about the cause of the failure.

In the past, trouble-shooting of NEXT and Return Loss faults with normal field test equipment has generally been done on a trial and error basis as it typically requires skill levels normally not available to the cable installation industry. Often, misinterpretations of frequency domain data are made, resulting in substantial unnecessary rework of the link.

For example, transmission parameter requirements have been established for various classes or categories of performance for structured data communication wiring systems. There are current standards for Category 3, (10 Megabit/second data systems), Category 5 (100 Megabit/second data systems) and new emerging standards (Category 6 and Category 7) to support even higher data rate systems. The Category 5 cabling system is a mature technology and few installation problems exist due to the excess margin that has evolved in the individual component designs.

However, with the emergence of higher performance Category 6 and Category 7 cabling systems, a significant percentage of such links do not meet desired performance levels. These links thus require a fault diagnosis. In general, the failures in these links are due to a lack of transmission performance margin in individual components and higher degrees of sensitivity to the installation practices that have been used for Category 5 and other systems that are pervasive in the market.

Figure 1:
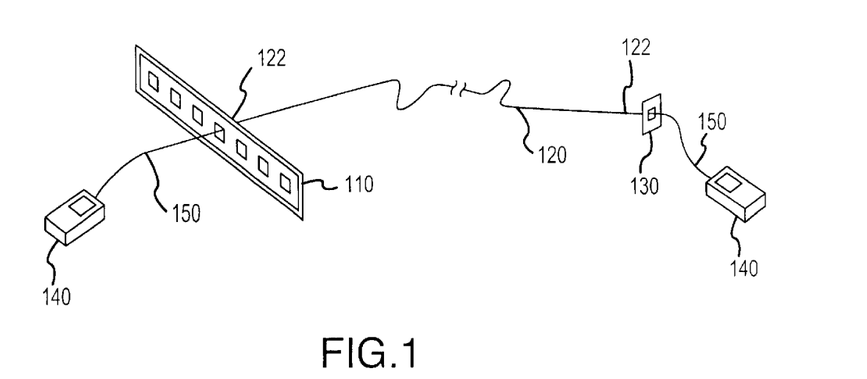
FIG. 1 is a typical link and field test configuration.

For example, a typical link 100 in a structured cabling system and associated field test. configuration is shown in the FIG. 1. Link 100 consists of a data communication patch panel 110 (for example, located in a wiring closet), four-pair twisted pair cable 120, and a data connector 130 in a work area. Field testing of the link transmission performance is typically done with field test equipment 140 that runs a Suite of frequency domain tests from both ends 122 of link 100. The field test equipment is interfaced through short test lead cables 150 that connect to data communication jacks 110, 130 of the link under test. Tests of NEXT, Return Loss, Insertion Loss, ELFEXT and the like, are typical measurements performed by these instruments to certify transmission parameters. The measurements are then compared to a set of known limit criteria established for specific categories of performance. A Pass/Fail indication is then made.

Figure 2:
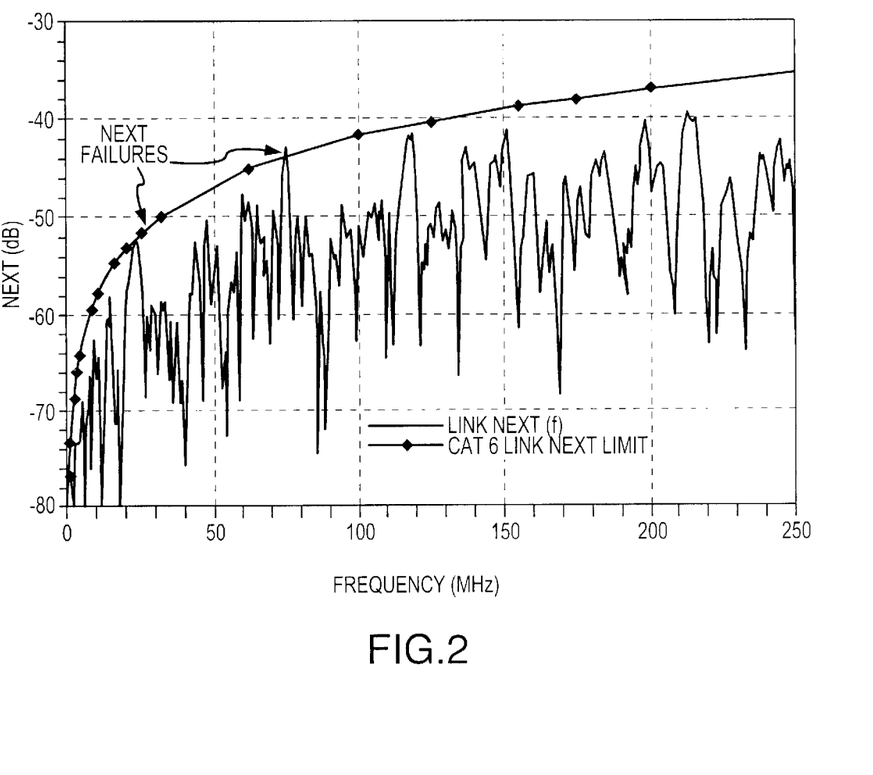
FIG. 2 is a graph showing NEXT vs. Frequency for a failing Category 6 Link.

An example of a NEXT measurement and the performance limit for a Category 6 link 100 is shown FIG. 2. The measured performance of link 100 exceeds the limit at one or more measured frequency points. The link is considered to have failed because it does not meet desired performance standards. The data in FIG. 2 shows a failure was detected at several regions of the frequency spectrum. A challenge in diagnosing this failure is determining if the cause of the failure is the connectors 110,130, cable 120, or the installation practices employed to terminate cable 120 to connectors 110,130. There is little information in the frequency domain graph of the magnitude of NEXT to help with the problem isolation process. Thus, a significant first step in the diagnostic process for the example shown in FIG. 2 is to locate the position of major contributors of NEXT in link 100 in time, and hence, distance.

Figure 3:
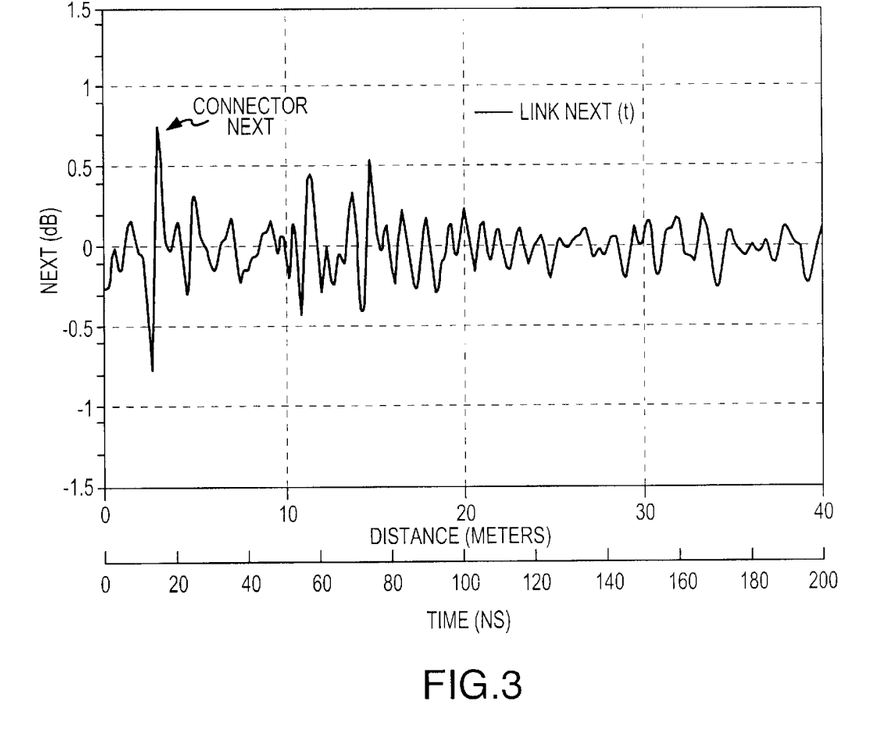
FIG. 3 is a graph showing NEXT vs. Time.

Those skilled in the art understand the conversion from the frequency domain to the time domain may be accomplished by applying an Inverse Fourier Transform process to the magnitude and phase NEXT frequency domain data. The result of this conversion provides a plot of changes in NEXT vs. time/distance. For example, the NEXT time response for the preceding example is shown in FIG. 3. As seen in the graph, there are a number of large sources of NEXT. The first major source is connector 110 located approximately two meters from the 'near' end 110 of test cable 120. As is apparent from the graph shown in FIG. 3, other large sources of NEXT exist within cable 120 itself.

Time domain techniques have been used to identify sources of NEXT in current field test equipment. However, knowledge of NEXT vs. time information does not necessarily aid in diagnosing the reason for failure. Time data itself can be useful since it identifies sources of NEXT as a function of distance; but this data itself does not provide information as to whether connector 110 or cable 120 performance is within required performance ranges. In FIG. 3, conventional wisdom points to connector 110 as the non-compliant component since it is the largest source of NEXT. However, without additional data, there is no definite information as to how to resolve the failure.

Figure 4:
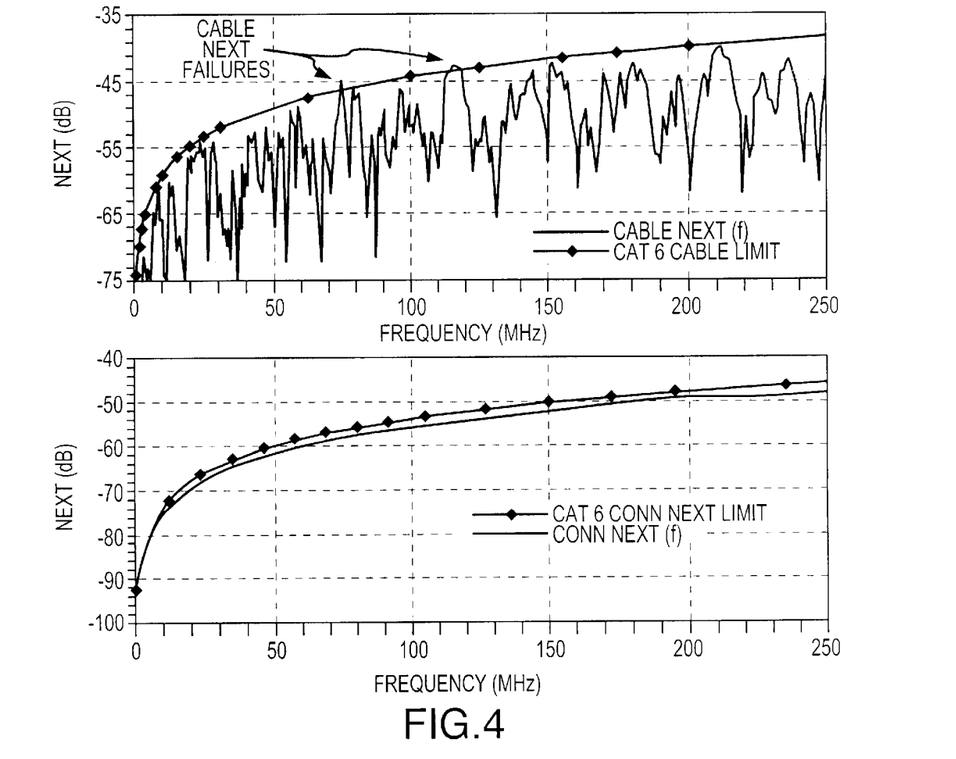
FIG. 4 is graph showing the NEXT of a cable and connector from a failing link.

One method of trouble-shooting the NEXT failure in link 100 is to disassemble link 100 and qualify the NEXT characteristic of each component relative to the component requirements. FIG. 4 shows NEXT measurement results for both cable 120 and connector 110 compared to one another and the respective NEXT limit for each component. In this case, connector 110, which was the highest NEXT source, falls within acceptable NEXT limits, and thus its performance requirements. However, the graph shows NEXT in cable 120 exceeds acceptable NEXT limits for cable 120. The cause of this failure is cable 120 and not connector 110. Time constraints, the knowledge and experience of cable technicians, and the impracticalities of reworking cabling systems make such disassembly for diagnosis impractical to do in the field.

Further, as FIG. 4 shows, the field diagnosis problem is quite difficult. Frequency domain measurements of link 100 do not generally provide fault location information. While time domain techniques are useful for locating sources of NEXT, they lack limit information to determine the components that are non-compliant. Thus, combining the use of time domain measurements with a method to convert the frequency domain component limits to the time domain would produce a major enhancement to the field diagnostic capability.

Another possible method to calculate the time limit and display time domain NEXT and Return Loss data is to attempt to normalize the limit data for attenuation with distance. Generally, this method generates a flat time limit line and produces data that has a flatter response with distance. Such a normalization process is disclosed in U.S. Pat. No. 5,698,985, entitled "Cross-Talk Measurement Instrument with Source Indication as a Function of Distance," issued to Bottman and assigned to Fluke on Dec. 16, 1997 (the "'985 patent"). While this approach appears simple and attractive, in practice it is difficult to properly implement and can provide misleading information. This is because the attenuation due to cable 120 is both a function of frequency and distance. Generally, the attenuation increases at approximately the square of the frequency. To normalize the time response for length generally requires special processing with time dependent filters that account for the length and transfer function. Simple scale factor normalization based on length as described in the '985 patent tends to enhance the low frequency contribution of the data with increasing length, leading to possible misdiagnosis of fault conditions.

Thus far, the examples and discussion have been related to NEXT measurements. However, additionally, return loss measurements have many of the same diagnostic issues that can be addressed in a similar manner using time domain limits and processing techniques.

Return loss measurements provide a measure of the ratio of the reflected energy to the transmitted energy. Generally, signal reflections occur within data communication cabling due to impedance changes in the transmission media. Major sources of reflection can occur at connections due to connecting hardware, poor installation, a change in cable impedance and the like. The normal certification tests are done in the frequency domain to verify the parameter is compliant with the requirement. The frequency domain Return Loss measurement provides an overall measure of reflected energy. However, the measurement does not separate the reflected signals from each of the individual components.

Accordingly, a method for determining if the transmission parameter fault is at the connection or in the cable would be of benefit to the cable installation industry. Since typical links are constructed of a single connection at each end of the cable, isolating the problem to either the connection or the cable allows for rapid rectification of the problem. Further, the application of time domain techniques along with time limits for the reflection that is allowed at a connection point would provide the installer with a means to diagnose Return Loss faults. Enhanced diagnostic capabilities are required to help successfully install and certify new higher performance cabling systems to significantly improve the productivity of the installation process with such diagnostics.

SUMMARY OF THE INVENTION

The present invention provides methods for using time domain analysis of NEXT, Return Loss and the like, in conjunction with the application of time or distance referenced limits to verify and determine compliance of the performance requirements of connections in a typical link. Time domain analysis of NEXT and Return Loss data suitably provides the performance characteristics of a link as a function of time or distance. When coupled with time or distance performance curves for connections, it can be determined if the transmission fault is at a connection, in the cable, or in another component of the link. The time limit curves for connections can be generated based on the frequency domain performance requirements for connecting hardware for a specific level of performance. The connection time limit curves thus provide an interpretation means to determine if the connection is within performance standards, affecting improved isolation of the fault condition.

BRIEF DESCRIPTION OF THE DRAWINGS

Additional aspects of the present invention will become evident upon reviewing the non-limiting embodiments described in the specification and the claims taken in conjunction with the accompanying figures, wherein like numerals designate like elements, and:

DETAILED DESCRIPTION OF PREFERRED EXEMPLARY EMBODIMENTS

The following descriptions are of exemplary embodiments only, and are not intended to limit the scope, applicability, or configuration of the invention in any way.

Rather, the following description provides a convenient illustration for implementing a preferred embodiment of the invention. It should be apparent that various changes may be made in the function and arrangement of the elements described in the following embodiments without departing from the spirit and scope of the invention as set forth in the appended claims.

Accordingly, the present invention relates generally to the development of a means to convert frequency domain limits for cabling link components into corresponding time domain limits and then to apply these limits to a diagnostic process to determine the location of a transmission fault.

It is generally recognized that LAN connecting hardware components are electrically short, and may have NEXT and Return Loss characteristics that may generally be considered as point NEXT and reflection sources. Ideal characteristics of these point sources can be described by simple frequency domain equations and converted to the time domain via various signal processing techniques such as Inverse Fourier Transform signal processing. Performance time limits are then used to determine if a connection meets the requirements of a certain category of performance.

Figure 5:
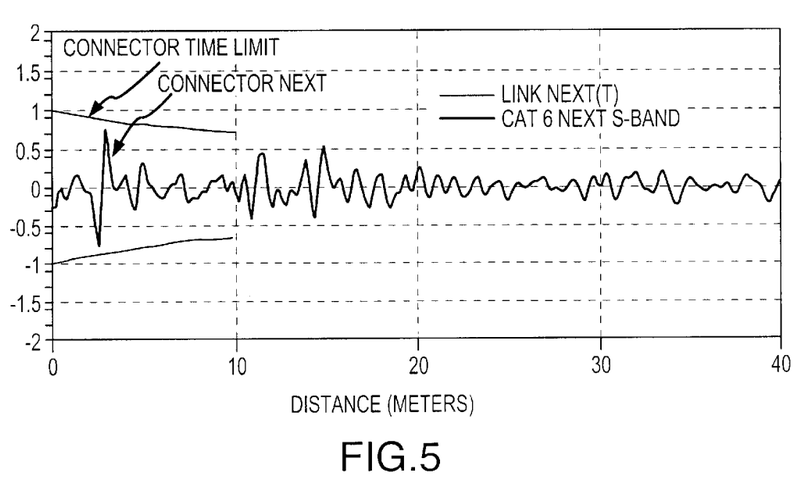
FIG. 5 is a graph showing the link NEXT time response for a failing link with a connector time limit showing a non-compliant cable.

An exemplary embodiment of applying a component time limit to the diagnostics problem in accordance with the present invention is shown in FIG. 5. In this graph, the time domain limit for a Category 6 connector is superimposed on the time data from the preceding failing Category 6 link example. Alternatively, other types of connectors may also be tested utilizing the methods and apparatus of the present invention. The time limit is denoted as an S-Band™ (Standard Connector Band). A compliant connection falls within these limits. Thus, FIG. 5 shows the connection is compliant with the NEXT specification for connecting hardware. Since the connector and its installation are within desired specifications, it can be concluded that the cable is the non-compliant component. The combination of time domain measurements to separate and locate sources of NEXT and a method to derive and apply time limits for connectors based on the frequency domain requirements thus solves a difficult diagnostic problem in this link.

Figure 6A:
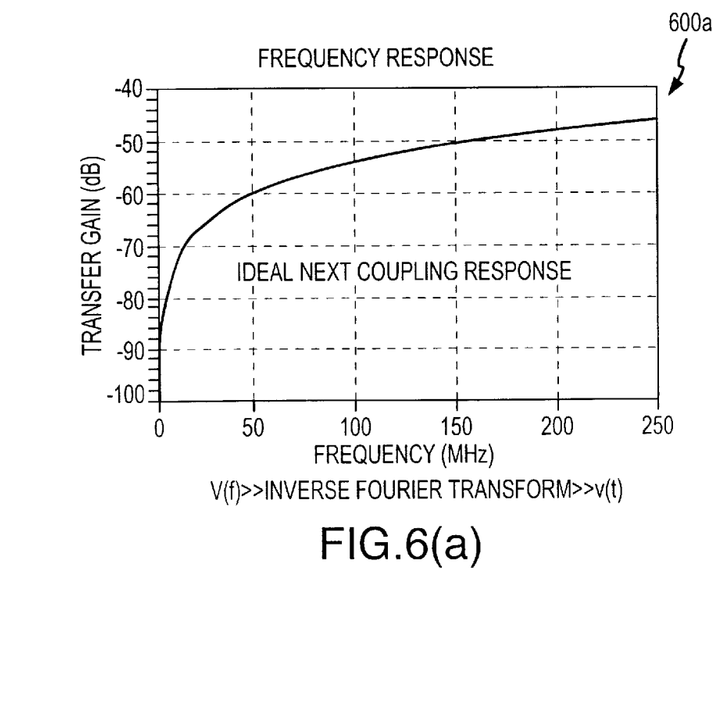
FIG. 6 is a graph showing the transformation of connector frequency domain characteristics to the time domain.
Figure 6B:
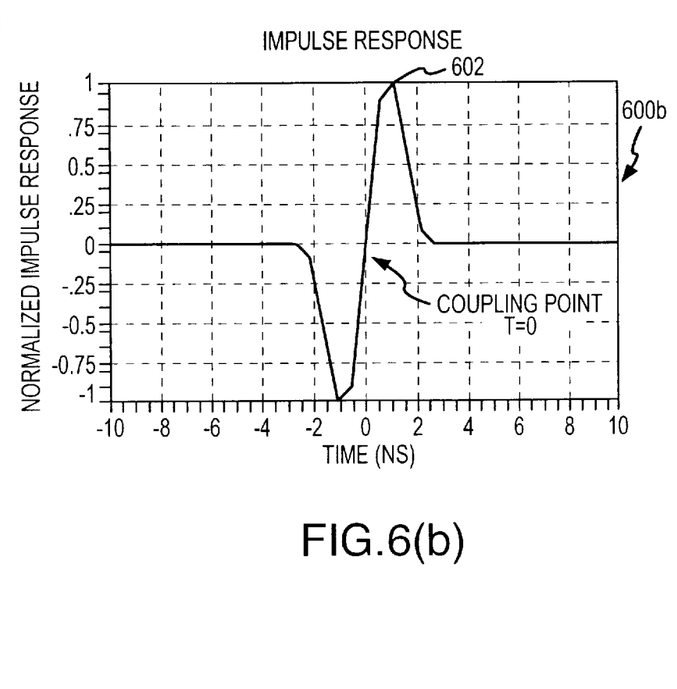

In accordance with an exemplary embodiment of the present invention, FIGS. 6a,b show a transformation of an ideal NEXT response 600a to the time domain. The computed time domain response for this transfer function is an ideal band limited impulse response 600b located at zero distance from the signal or test source. The transformation process allows computation of impulse response 600b for ideal NEXT sources, Return Loss (i.e., reflection) sources or the like whose frequency domain characteristics suitably follow the requirements for specific categories of performance for cables such as Category 5, 5E, 6 and 7 and the like. A peak response 602 of the limit impulse represents an allowable maximum for a measured time response in order to be compliant with the frequency domain limit 600a.

In a preferred embodiment of the present invention, the preceding limit transformation suitably allows calculation of the time response limit for a single coupling or reflection source located at zero distance from the test source, though the connectors in a link may be located at varying distances from the test source. For example, the distance to the connector is typically about 1 to 2 meters (the length of the test cable). The time limit thus would be calculated for about two meters or greater. A series of responses is then suitably calculated at incremental distances beyond zero distance from the test source to derive a smooth limit line that extends beyond the expected position of the first connector. The computation of this time limit line thus suitably accounts for both propagation delay and frequency dependent attenuation of the cable that connects the test source to the first connection of the link.

Figure 7A:
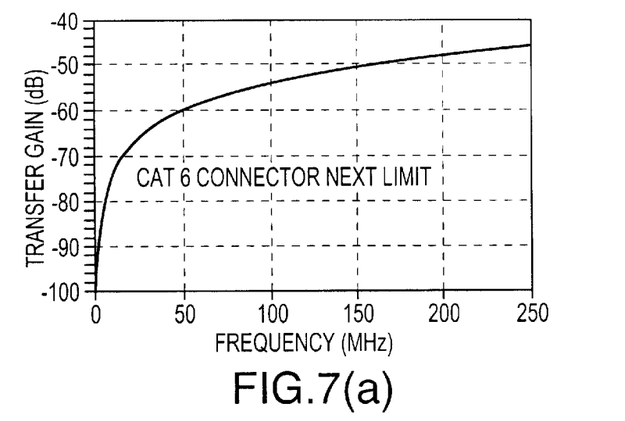
FIG. 7 is a diagram showing the process to calculate time limits.
Figure 7B:
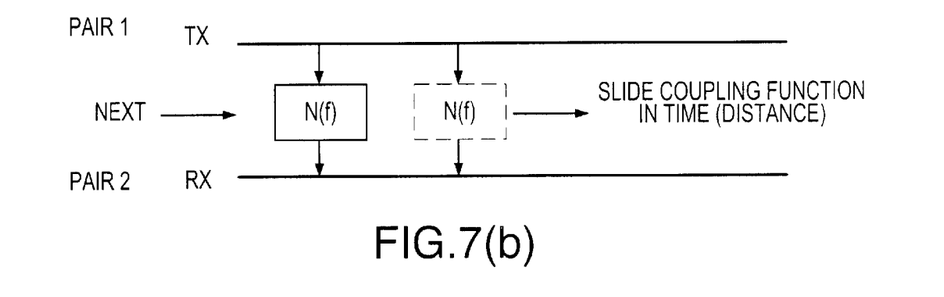
Figure 7C:
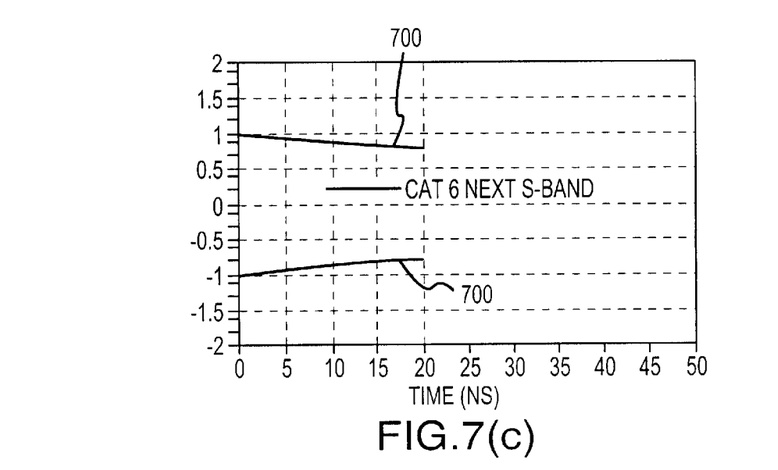
Figure 9:
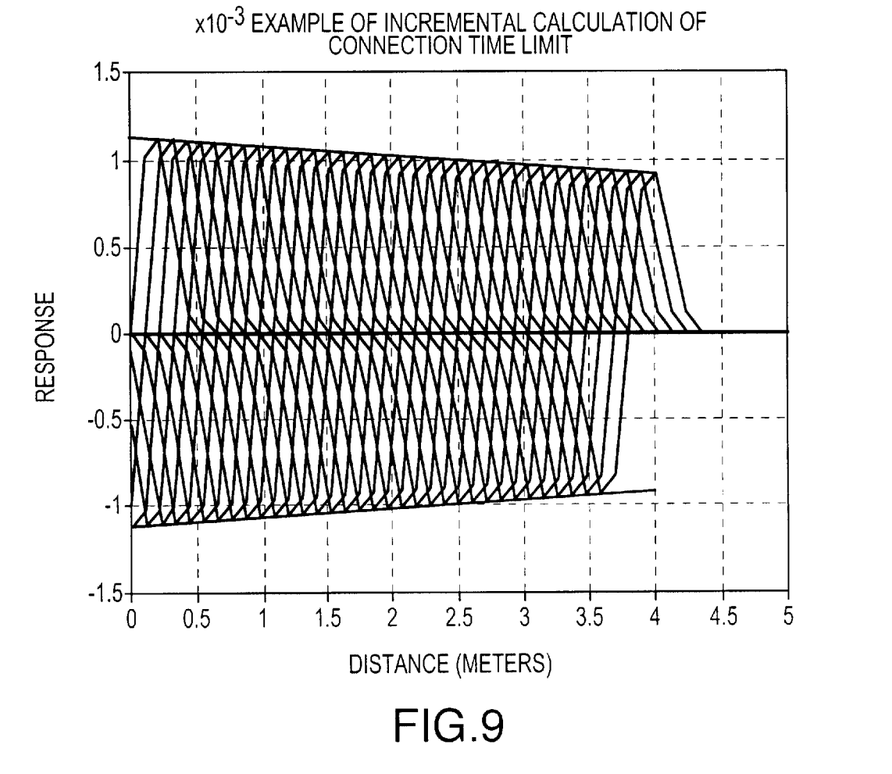
FIG. 9 is a graph showing the incremental process of building a time limit line in accordance with the present invention.

The determination of the time limit is generally done by any suitable means. However, a method for obtaining the entire time NEXT limit in accordance with a preferred embodiment of the present invention is outlined in FIG. 7. First, with reference to FIG. 7a, the frequency domain connector limit is used as its transfer function. Then, assuming nominal frequency dependent attenuation characteristics of cable 120, FIG. 7b illustrates the computation of the overall frequency domain transfer function when the connector is placed at increasing incremental distances down the cable so that impulse response 600b for the transfer function at each distance is processed. Next, as shown in FIG. 7c and FIG. 9, the envelope of the peak responses 700 for all distances is determined to compute the time domain limit for the connector.

In accordance with an alternate aspect of the present invention, an alternative method to obtain the desired connection limit curve is to use a connection of suitable characteristics and physically position the connector at incrementally increasing distance from the reference point and measure the time response of the connector at each distance. The limit curve can then be represented by a smooth curve that corresponds to the peak time response of the connection at each distance.

In accordance with the present exemplary embodiment, the foregoing method for calculating a NEXT time limit begins with assuming connector NEXT characteristics that generally follow defined frequency limits for specific categories of performance (e.g., as Category 5, 6, 7 and the like). That is, the connector is assumed to be located at time zero or zero distance from the test instrument. The overall NEXT characteristics are then calculated and transformed to the time domain via suitable processing techniques such as an Inverse Fourier Transform, Wavelet Transform, Hartley Transform or the like. The connection is then assumed to be located at small incremental distances from the test instrument, and the overall NEXT characteristics are then calculated assuming suitable cable attenuation and propagation constants. This response is then transformed to the time domain. The process is repeated assuming the connection is moved small incremental distances from the test instrument and the envelope of the peak time responses for each distance is calculated using a suitable means to form a smooth time limit line. Impulse frequency response 600b is then applied to limits 700 and the location of any failure in the link is determined by observation of the location where response 600b exceeds limits 700.

According to an alternative embodiment of the present invention, a similar method can be used to calculate Return Loss time limits. Generally, in the case of Return Loss, impedance differences between the test cable and link cable are considered along with the connector reflection characteristics. A process to generate the Return Loss time assumes a minimally compliant connector and compliant impedances of the test and link cable. Similar to the embodiment described above with respect to determination of NEXT faults, a frequency domain return loss for these elements is computed with the connection at increasing distances from the source. The time response is calculated at each distance and the envelope of the peak responses is again formed as an allowable time limit. Again, the resulting time limits are a set of substantially symmetric curves that may be normalized to unity at time zero.

In accordance with an additional aspect of the present invention and in the preferred embodiment, normalization to unity at time zero makes comparisons to actual data more convenient to interpret. The time limit curves decrease in magnitude to follow the nominal frequency dependent attenuation that is expected in the cable. NEXT and Return Loss time data suitably reduce at this rate due to round trip attenuation of the cable. NEXT and Return Loss time limits can be calculated for connectors of any performance level. For example, for field diagnostic purposes, particular time limits are calculated for Category 5, 5E, 6, and 7 connectors.

Figure 8:
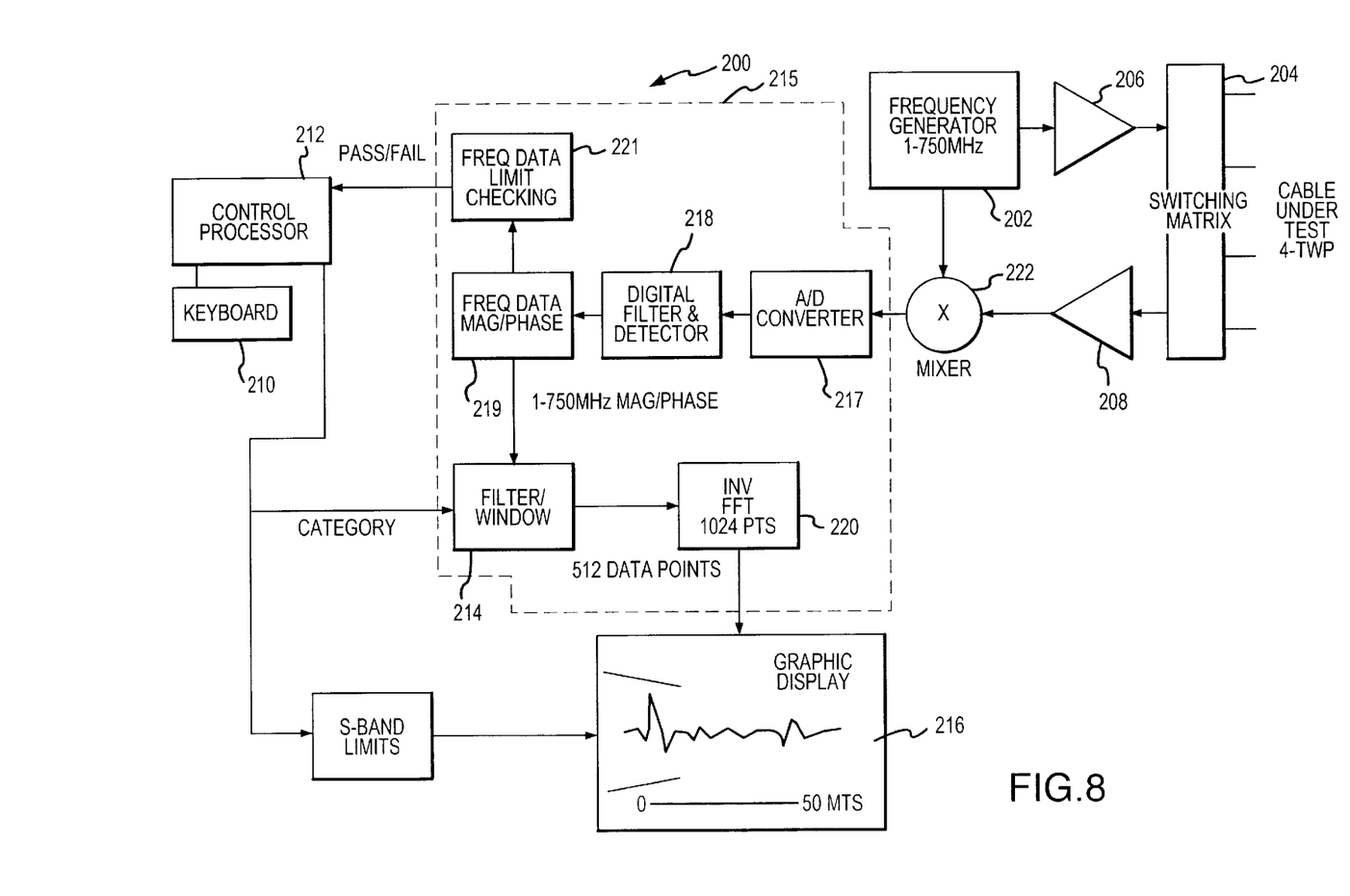
FIG. 8 is a block diagram of a frequency domain cable field certification tool with time domain diagnostics.

A simplified block diagram of a preferred embodiment of a cable field certification instrument 200 with enhanced diagnostic capabilities is shown in FIG. 8. The measurement system 200 is based on a swept frequency domain system that detects both magnitude and phase of the received signals. Full vector frequency domain data is suitably used to allow time information to be extracted by, for example, a Fourier transform signal processing technique. The breadth of measurement range is generally known as the "dynamic range," and test instrument 200 is able to measure signals having a range of about 100 dB. The frequency domain approach of the present invention suitably supports such a dynamic range due to its ability to generate large signal powers at a single frequency. The large transmit signal thus maintains the smaller received signal above intrinsic circuit noise levels.

In accordance with the presently described exemplary embodiment, test instrument 200 measurement circuits consist of a frequency generator 202 of about 1 MHz–750 MHz, a switch matrix 204 to connect a transmitter 206 which transmits the test signal, and a receiver 208 which receives the response signal from the link being tested, and signal processing circuits 215 for detection and limit checking of received data using the methods of the present invention. Preferably, the receiver function is implemented through narrow band heterodyne techniques that allow tracking of the transmit signal and rejection of undesired signals.

Preferably signal processing circuits 215 of the present exemplary embodiment consist of a suitable analog to digital converter 217, a digital filter and detector 218 which processes one or more digitally converted samples of the intermediate frequency output of the mixer 222 into a complex, i.e. real and imaginary value, for each frequency. These complex valued signals are mathematically converted into magnitude and phase using a suitable rectangular-to-polar transformation mechanism 219. These frequency domain data results may also be processed and stored in internal or external memory for further certification tests. The magnitude values are further suitably converted into decibel values and compared frequency-by-frequency to the suitable frequency domain limits 221, and a pass or fail indication is suitably generated and sent to the control processor 212. The complex valued signals from digital filter and detector 218 are also routed to a suitable filter/windowing function 214 in order to provide a desired level of anti-aliasing and effective impulse shaping, described in more detail below. Filter/window 214 applies a suitable scaling coefficient to each complex data value (sample) according to the frequency at which it was acquired. These windowed complex signals for each frequency are taken together and applied to an inverse Fourier Transform mechanism 220 (for example, a Cooley-Tukey Fast Fourier Transform or the like), to suitably convert the frequency domain signal into a time domain representation.

According to the various aspects of the present invention, control processor 212 initiates tests in response to user commands through an input device 210 such as, for example, a keyboard, keypad, push buttons or the like. The test results are suitably stored in a standard control processor memory. The native frequency domain data results can be processed and stored for any certification tests. Link specification limits may be defined as a function of frequency and reports may be used to show at what frequency failures occurred. In accordance with an alternative aspect of the present invention, a similar measurement and processing system may be used in the remote scanner unit to allow the same measurements to be performed at the far end of the link.

In accordance with the present invention, the user initiates diagnostic measurements via keyboard 210 commands or through other suitable means if a failure is detected. In the preferred embodiment, these commands initiate a NEXT or Return Loss measurement on the desired pairs of cables up to the full frequency range of about 1–750 MHz. The frequency data may then be processed and detected and passed through a frequency filter and window prior to the Inverse Fourier Transform operation. These measurements can be done at either end of the link in a main or remote unit and to allow diagnostic functions to be performed on either end.

In accordance with another aspect of the present invention, filter/window function 214 is applied to the data prior to the inverse Fourier operation. The window function 214 is suitably selected to produce substantially flat time filters and band limit data within the component specified frequency range. Preferably, filter/window function 214 is determined by the category of link that is to be tested. For example, Category 5 and 5E component performance might be specified as about 100 MHz, and therefore an appropriate filter/window is selected to limit the high frequency data that is transformed to the time domain. In contrast, for Category 6 and 7 links, the window function would preferably limit data to approximately the 250 MHz maximum frequency specification for Category 6 and 7 links.

Next, the filtered data is suitably processed via a 1024 point inverse FFT algorithm to convert it to the time domain where it may then be displayed on a graphic display module 216 of the instrument. The time data is suitably scaled relative to the selected time limit which may also be displayed for diagnostic reference. The time limit information may be pre-computed and stored in the processor control memory. The appropriate time limit curve may be displayed as a function of the performance of the category of the tested link. In the preferred embodiment, the x-axis of the graph is scaled in length to allow the user to determine the distance to a fault or event. The user can then view the time response to determine if the link connections are within the time domain limits and make a decision as to whether the connection is the cause of the fault. Thus, the combination of the time limits and time domain presentation of NEXT and Return Loss data in data communication cable field test equipment provides a significant enhancement to the field trouble shooting process.

Lastly, it should be apparent that while the principles of the invention have been described in illustrative embodiments, many combination and modification of the above-described steps, structures, arrangements, proportions, the elements, materials and components, used in the practice of the invention in addition to those not specifically described may be varied and particularly adapted for specific environments and operating requirements, without departing from the principles of the present invention. For example, though not specifically described, it is possible to make NEXT and Return Loss measurements via a time domain pulse transmission approach. These results can then be displayed relative to a connector time domain limit to provide the enhancement to the diagnostics function and still fall with the ambit of the appended claims.

We claim:

1. An apparatus for determining the location of a fault in a cable link, comprising:
    a frequency generator for generating a test signal to test the cable link;
    a control processor which receives input from a user and controls said frequency generator;
    a transmitter for transmitting said test signal through the cable link;
    a receiver for receiving said test signal after said test signal has passed through the cable link; and
    a signal processing circuit coupled to said receiver, wherein
        said signal processing circuit calculates a signal representative of a performance characteristic at a first distance based on said received test signal and compares said calculated signal to a desired performance limit to generate a limit comparison, and further
    wherein said signal processing circuit comprises:
        an analog to digital converter;
        a digital filter and detector coupled to said analog to digital converter configured to convert an input signal into a complex value;
        a transforming mechanism coupled to said digital filter and detector, configured to convert the complex value from rectangular to polar coordinates comprising a magnitude and a phase; and
        a comparator coupled to said transforming mechanism configured to compare said magnitude with a predetermined value.

2. The apparatus according to claim 1 wherein said signal processing circuit adds an incremental distance to said first distance to create a second distance and obtains said signal representative of said performance characteristic at said second distance and compares said received test signal to said desired performance limit to generate said limit comparison.

3. The apparatus according to claim 1, wherein said performance characteristic is a signal coupling characteristic.

4. The apparatus according to claim 3 wherein said signal coupling characteristic is a cross-talk reading.

5. The apparatus according to claim 4, wherein said cross-talk reading is a near end cross-talk reading.

6. The apparatus according to claim 1 wherein said performance characteristic is a reflection characteristic reading.

7. The apparatus according to claim 6, wherein said reflection characteristic reading is a return loss reading.

8. The apparatus according to claim 1 wherein said frequency generator generates test signals ranging from about 1 to 750 MHz.

9. The apparatus according to claim 1 wherein said comparison is displayed on an output device.

10. The apparatus according to claim 9 wherein said output device is a graphical display.

* * * * *